United States Patent

Mack et al.

Patent Number: 5,757,018
Date of Patent: May 26, 1998

[54] ZERO DEFLECTION MAGNETICALLY-SUPPRESSED FARADAY FOR ION IMPLANTERS

[75] Inventors: Michael E. Mack, Manchester; Ronald F. Holsinger, Carlisle, both of Mass.

[73] Assignee: Varian Associates, Inc., Palo Alto, Calif.

[21] Appl. No.: 763,250

[22] Filed: Dec. 10, 1996

Related U.S. Application Data

[60] Provisional application No. 60/008,497, Dec. 11, 1995.

[51] Int. Cl.$^6$ ................................................. H01J 37/244
[52] U.S. Cl. ..................... 250/492.21; 250/397; 250/251
[58] Field of Search ...................... 250/492.21, 492.2, 250/397, 398, 251, 396 R

[56] References Cited

U.S. PATENT DOCUMENTS

| | | | |
|---|---|---|---|
| 4,011,449 | 3/1977 | Ko et al. | 250/492.21 |
| 4,135,097 | 1/1979 | Forneris et al. | 250/492 B |
| 4,228,358 | 10/1980 | Ryding | 250/457 |
| 4,234,797 | 11/1980 | Ryding | 250/492 B |
| 4,361,762 | 11/1982 | Douglas | 250/251 |
| 4,463,255 | 7/1984 | Robertson et al. | 250/251 |
| 4,587,433 | 5/1986 | Farley | 250/492.2 |
| 4,595,837 | 6/1986 | Wu et al. | 250/492.2 |
| 4,751,393 | 6/1988 | Corey, Jr. et al. | 250/492.21 |
| 4,775,796 | 10/1988 | Purser et al. | 250/492.21 |
| 4,786,814 | 11/1988 | Kolondra et al. | 250/492.2 |
| 4,804,837 | 2/1989 | Farley | 250/251 |

Primary Examiner—Kiet T. Nguyen

[57] ABSTRACT

A magnetically suppressed Faraday system for use in an ion beam treatment system, such as an ion implanter, includes a Faraday cage defining a chamber having an entrance, and a magnetic suppression assembly positioned at the entrance of the chamber. The downstream end of the Faraday cage is positioned adjacent to a workpiece such as a semiconductor wafer. The magnetic suppression assembly includes a suppression magnet structure for producing suppression magnetic fields of sufficient strength to inhibit escape of electrons from the chamber, a field cancellation magnet structure for producing cancellation magnetic fields for substantially canceling magnetic fields, produced by other magnets in the magnetic suppression assembly, near the downstream end of the chamber, and an angle correction magnet structure for producing angle correction magnetic fields selected such that the ion beam is subjected to zero or nearly zero net angular deflection as it passes through the Faraday system.

24 Claims, 9 Drawing Sheets

ZERO DEFLECTION MAGNETICALLY-SUPPRESSED FARADAY FOR ION IMPLANTERS

CROSS REFERENCE TO RELATED APPLICATION

This application claims the benefit of provisional application Ser. No. 60/008,497 filed Dec. 11, 1995.

FIELD OF THE INVENTION

This invention relates to systems for ion implantation of semiconductor wafers and, more particularly, to a magnetically suppressed Faraday system for ion dose measurement in an ion implantation system.

BACKGROUND OF THE INVENTION

Ion implantation has become a standard technique for introducing conductivity-altering impurities into semiconductor wafers. A desired impurity material is ionized in an ion source, the ions are accelerated to form an ion beam of prescribed energy and the ion beam is directed at the surface of the wafer. The energetic ions in the beam penetrate into the bulk of the semiconductor material and are embedded in the crystalline lattice of the semiconductor material to form a region of desired conductivity.

Ion implantation systems usually include an ion source for converting a gas or a solid material into a well-defined ion beam. The ion beam is mass analyzed to eliminate undesired ion species, is accelerated to a desired energy and is directed onto a target plane. The beam is distributed over the target area by beam scanning, by target movement or a combination of beam scanning and target movement. In one conventional approach, semiconductor wafers are mounted near the periphery of a disk. The disk is rotated about its central axis and is translated with respect to the ion beam to distribute the ion beam over the semiconductor wafers.

In the operation of an ion implantation system, it is usually necessary to measure the cumulative ion dose implanted in the semiconductor wafer, since the number of ions implanted determines the conductivity of the implanted region. Typically, ion implants are specified in terms of ion species, ion energy and dosage in ions per square centimeter. Continuous measurement of ion dosage is necessary, since ion sources typically do not deliver accurate, constant ion beam currents. Semiconductor fabrication processes typically require dose accuracy within 1%.

Cumulative ion dose is typically measured by a Faraday cup, or Faraday cage, positioned in front of the target wafer. The Faraday cage is typically a conductive enclosure, often with the wafer positioned at the downstream end of the enclosure and constituting part of the Faraday system. The ion beam passes through the Faraday cage to the wafer and produces an electrical current in the Faraday. The Faraday current is supplied to an electronic dose processor, which integrates the current with respect to time to determine the total ion dosage. The dose processor may be part of a feedback loop that is used to control the ion implanter. For example, ion implantation may be terminated when a predetermined dose has been reached.

One of the conventional components of a Faraday system is an electrostatic electron suppression electrode positioned at the entrance to the Faraday cage. When energetic ions in the ion beam impinge on the semiconductor wafer or on the rotating disk, secondary electrons are generated. When an energetic ion hits a metal surface, two to ten secondary electrons may be generated. In addition, an electron flood gun or plasma flood gun is typically mounted in the Faraday system. The electron flood gun or plasma flood gun generates electrons for neutralizing the surface charge which results from ion implantation of positively charged ions in the semiconductor wafer. A portion of the secondary electrons and the electrons generated by the flood gun may escape from the Faraday cage through its entrance. Escape of these electrons from the Faraday cage produces a measurement error. By negatively charging the electrostatic electron suppression electrode at the entrance to the Faraday cage, the escape of electrons is effectively eliminated.

Various Faraday cage configurations for ion implanters have been shown in the prior art. A Faraday cage having an electrostatic electron suppression electrode is disclosed in U.S. Pat. No. 4,135,097 issued Jan. 16, 1979 to Forneris et al. U.S. Pat. No. 4,135,097 also discloses a Faraday cage utilizing a pair of magnets for electron suppression. Faraday cages positioned in front of semiconductor wafers are also disclosed in U.S. Pat. Nos. 4,463,255 issued Jul. 31, 1984 to Robertson et al; 4,361,762 issued Nov. 30, 1982 to Douglas; 4,786,814 issued Nov. 22, 1988 to Kolondra et al; and 4,595,837 issued Jun. 17, 1986 to Wu et al. Faraday cages positioned behind a rotating disk are disclosed in U.S. Pat. Nos. 4,228,358 issued Oct. 14, 1980 to Ryding; 4,234,797 issued Nov. 18, 1980 to Ryding; and 4,587,433 issued May 6, 1986 to Farley. It is understood by applicants that Faraday cages positioned behind a rotating disk have utilized magnetic suppression of electrons.

The electrostatic suppression electrodes typically utilized in Faraday cages are subject to buildup of an insulating coating during use. The insulating coating may originate, for example, from photoresist used on the semiconductor wafer being implanted. The insulating coating on the electrostatic suppression electrodes may experience a charge buildup on its surface. The voltages applied to the suppression electrodes, typically on the order of 1–2 kilovolts, produce microdischarges in the insulating coating. The microdischarges in turn generate particles which may contaminate the surface of the semiconductor wafer. Such contamination is highly undesirable.

Magnetic suppression techniques, as disclosed in the aforementioned U.S. Pat. No. 4,135,097, avoid the microdischarges and resultant contamination associated with electrostatic suppression electrodes. However, prior art magnetic suppression techniques have other disadvantages. An ion beam passing through a transverse magnetic field is deflected from its normal path. Since the angle of incidence of the ion beam with respect to the surface of the semiconductor wafer is carefully controlled because of channeling effects, any deflection which changes the angle of incidence is undesirable. Furthermore, the magnetic fields associated with magnetic suppression of electrons may adversely affect the operation of the electron flood gun or plasma flood gun used to neutralize the wafer surface.

SUMMARY OF THE INVENTION

A magnetically suppressed Faraday system and an ion implanter incorporating the magnetically suppressed Faraday system are provided in accordance with the present invention. According to a first aspect of the invention, a magnetically suppressed Faraday system for use in an ion beam treatment system comprises a Faraday cage defining a chamber having an entrance and a downstream end adapted to be positioned adjacent to a workpiece, and a magnetic suppression assembly positioned at the entrance of the chamber. The magnetic suppression assembly includes a suppression magnet structure for producing suppression magnetic fields of sufficient strength to inhibit escape of electrons from the chamber and a field cancellation magnet structure for producing cancellation magnetic fields for substantially canceling magnetic fields, produced by other magnets in the magnetic suppression assembly, near the downstream end of the chamber.

The magnetically suppressed Faraday system may further comprise a flood gun, positioned near the downstream end of the chamber, for providing electrons at the downstream end of the chamber. The magnetic suppression assembly preferably produces a net magnetic field of less than about two Gauss near the downstream end of the chamber between the flood gun and the workpiece.

According to another aspect of the invention, a magnetically suppressed Faraday system for use in an ion beam treatment system comprises a Faraday cage defining a chamber having an entrance and a downstream end adapted to be positioned adjacent to a workpiece, and a magnetic suppression assembly positioned at the entrance of the chamber. The magnetic suppression assembly includes a suppression magnet structure for producing suppression magnetic fields of sufficient strength to inhibit escape of electrons from the chamber and an angle correction magnet structure for producing angle correction magnetic fields selected such that the ion beam is subjected to zero or nearly zero net angular deflection as it passes through the Faraday system.

The magnetic suppression assembly preferably includes the suppression magnet structure, the angle correction magnet structure and the field cancellation magnet structure. The preferred magnetic suppression assembly produces magnetic fields which inhibit escape of electrons from the chamber, which have a steep gradient along the beam path between the entrance and the downstream end of the chamber and which produce zero or nearly zero net angular deflection of the ion beam. Preferably, the suppression magnet structure comprises suppression magnet elements positioned on opposite sides of the beam path, the cancellation magnet structure comprises cancellation magnet elements positioned on opposite sides of the beam path between the suppression magnet structure and the downstream end of the chamber, and the angle correction magnet structure comprises angle correction magnet elements positioned on opposite sides of the beam path upstream of the suppression magnet structure.

In a first embodiment, the magnetic suppression assembly further comprises first pole pieces disposed on the suppression magnet elements, second pole pieces disposed on the cancellation magnet elements, third pole pieces disposed on the angle correction magnet elements, first isolation magnets disposed between the first and second pole pieces, and second isolation magnets disposed between the first and third pole pieces.

In a second embodiment, the magnetic suppression assembly further comprises first isolation magnets disposed between the suppression magnet elements and the cancellation magnet elements, second isolation magnets disposed between the suppression magnet elements and the angle correction magnet elements, and a magnetic field clamp positioned between the cancellation magnet structure and the workpiece.

According to a further aspect of the invention, an ion implanter comprises an ion source for generating an ion beam and for directing the ion beam along a beam path, an end station for positioning a semiconductor wafer in the beam path, and a magnetically suppressed Faraday system positioned along the beam path. The magnetically suppressed Faraday system comprises a Faraday cage defining a chamber having an entrance and a downstream end positioned adjacent to the semiconductor wafer, a flood gun, positioned near the downstream end of the chamber, for providing electrons at the downstream end of the chamber and a magnetic suppression assembly positioned at the entrance of the chamber. The magnetic suppression assembly comprises a suppression magnet structure for producing suppression magnetic fields of sufficient strength to inhibit escape of electrons from the chamber, an angle correction magnet structure for producing angle correction magnetic fields selected such that the ion beam is subjected to zero or nearly zero net angular deflection as it passes through the Faraday system, and a field cancellation magnet structure for producing cancellation magnetic fields for substantially canceling magnetic fields, produced by other magnets in the magnetic suppression assembly, between the flood gun and the semiconductor wafer.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
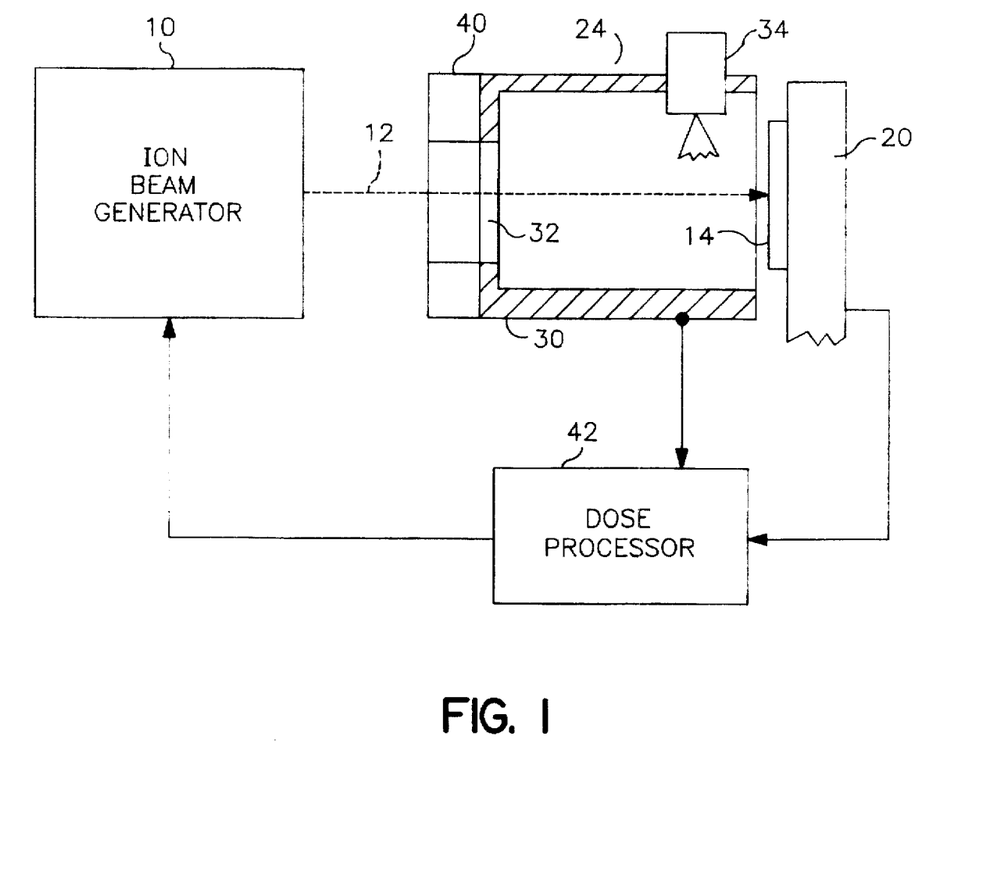
FIG. 1 is a schematic block diagram of an ion implanter incorporating a Faraday system.

A simplified schematic diagram of an ion implanter incorporating a Faraday system is shown in FIG. 1. An ion beam generator 10 directs an ion beam 12 at a target, typically a semiconductor wafer 14. In the example of FIG. 1, the wafer 14 is mounted on a rotating disk 20. The rotating disk 20 is typically part of an end station 16 which may include wafer handling equipment for loading wafers into the system for ion implantation and for unloading wafers from the system following ion implantation. The ion beam generator 10 typically includes an ion source, including extraction electrodes for forming a well-defined ion beam, a mass analyzing magnet and a resolving slit for removing undesired species from the ion beam, and an accelerator for accelerating ions in the beam to desired energies. The ion beam generator 10 may also include ion optical elements for focusing the ion beam and beam deflectors for deflecting the beam in one or more directions. Many different ion implanter configurations are known to those of skill in the art. The wafer 14 is not necessarily mounted on a rotating disk 20, but may be mounted on any suitable wafer support device. The ion beam 12 is distributed over the wafer surface by beam deflection, by movement of the wafer or by a combination of beam deflection and wafer movement. The entire region between the ion source and the wafer 14 is maintained at high vacuum during operation of the ion implanter.

A Faraday system 24 is positioned in front of wafer 14 and is used in connection with measurement of ion beam 12. The Faraday system 24 includes a Faraday cage 30 comprising a conductive enclosure having an entrance opening 32 for receiving ion beam 12. The wafer 14 and rotating disk 20 are positioned at the opposite end of Faraday cage 30 from opening 32. An electron flood gun 34 or a plasma flood gun is mounted in Faraday cage 30 near the wafer 14 for neutralizing charges on wafer 14. A magnetic suppression assembly 40 is positioned at the entrance opening 32 of Faraday cage 30. The magnetic suppression assembly 40, described in detail below, produces magnetic fields which inhibit escape of electrons from Faraday cage 30.

The rotating disk 20 and the Faraday cage 30 are electrically connected to a dose control processor 42. The dose control processor 42 receives from rotating disk 20 and Faraday cage 30 an electrical current that is representative of the ion beam current delivered to wafer 14. As known in the art, the dose control processor 42 integrates the current with respect to time to determine total ion dosage applied to wafer 14. The dose control processor 42 can be used to control ion beam generator 10. For example, ion implantation of wafer 14 can be terminated when a predetermined ion dosage is reached.

Figure 2:
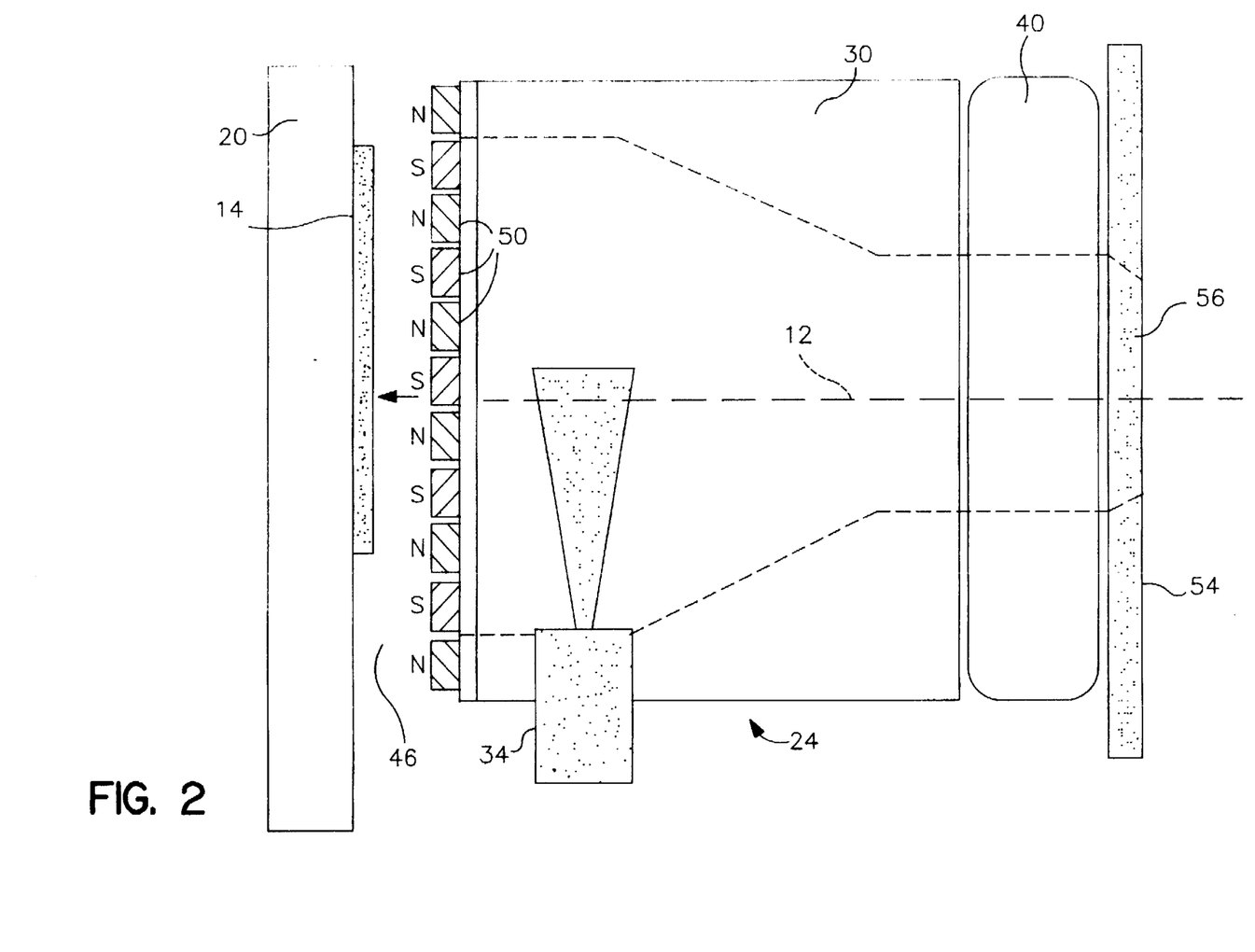
FIG. 2 is a simplified cross sectional view of a Faraday system in accordance with the present invention.

The Faraday system 24 is further illustrated in FIG. 2. Like elements in FIGS. 1 and 2 have the same reference numerals. A gap 46 is provided between the rotating disk 20 and the downstream end of Faraday cage 30 to permit unrestricted rotation of disk 20 with respect to Faraday cage 30. The dimension of gap 46 parallel to ion beam 12 is minimized to the extent that is practical to limit escape of electrons from Faraday cage 30 through gap 46. Preferably, multiple permanent magnets 50 are positioned around the opening in the downstream end of Faraday cage 30 to further limit lateral escape of electrons through gap 46. In a preferred embodiment, the disk 20 may be tilted by up to 7° with respect to the ion beam 12 to control channeling in the crystal structure of wafer 14. Preferably, the Faraday system 24 is mounted so as to tilt with disk 20. A graphite plate 54 having an aperture 56 is positioned in front of magnetic suppression assembly 40. The graphite plate 54 prevents incidence of ion beam 12 on the magnetic suppression assembly 40. The graphite plate 54 is separately grounded so the charged particles incident on it are not measured by the dose control processor 42.

Figure 3:
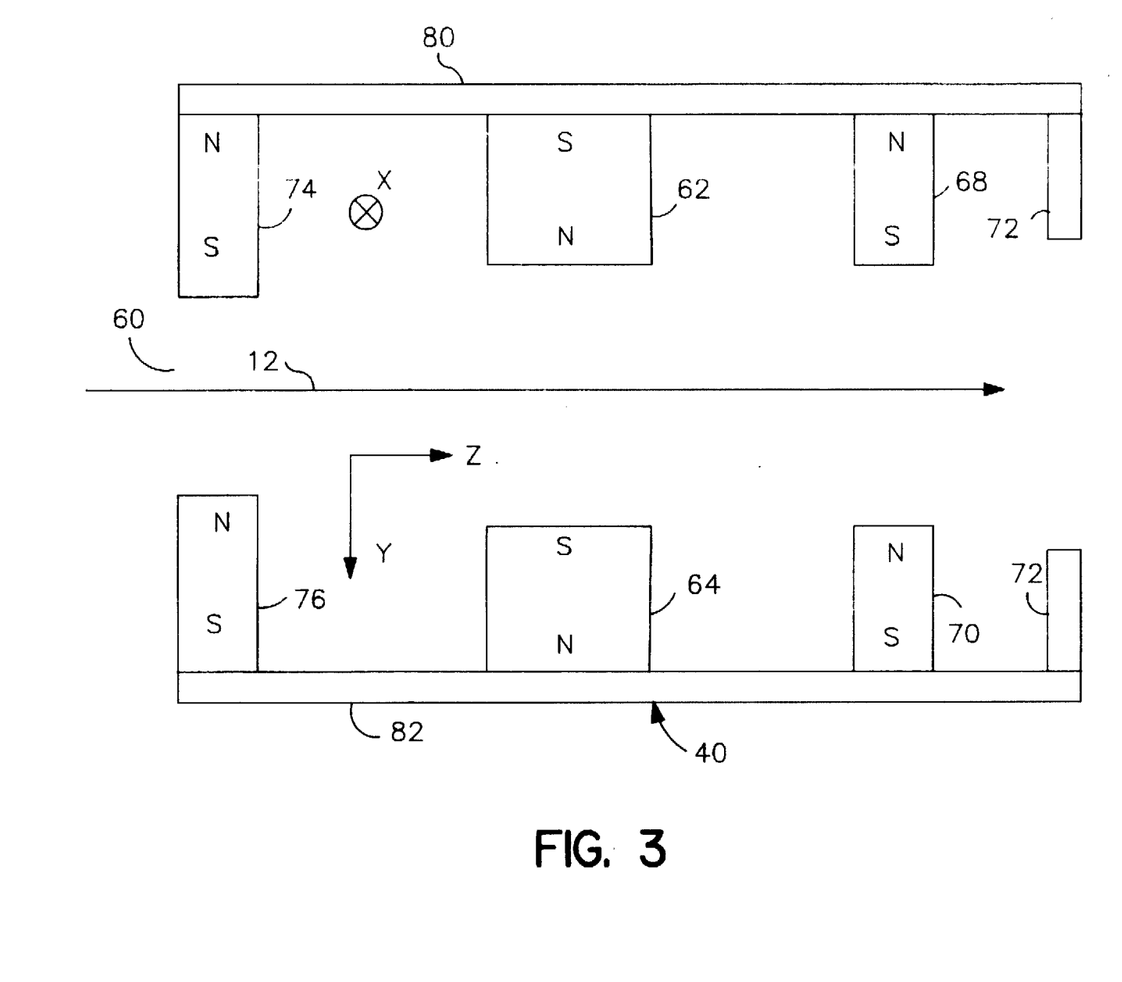
FIG. 3 is a simplified top view of the magnetic suppression assembly of FIG. 2.
Figure 4:
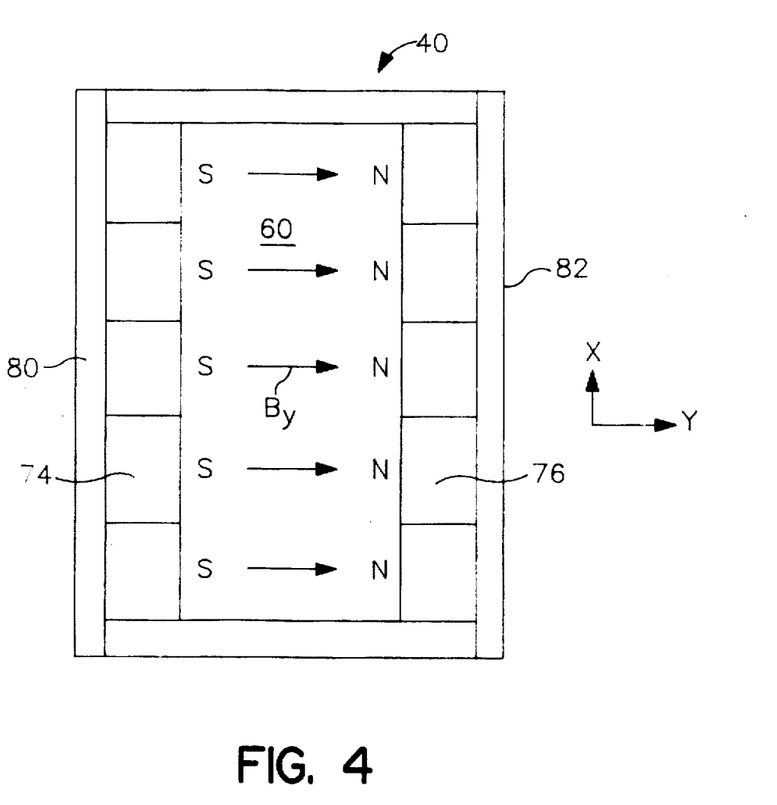
FIG. 4 is an elevation view of the magnetic suppression assembly, viewed along the ion beam axis.

A schematic top cross-sectional view of the magnetic suppression assembly 40 is shown in FIG. 3. An elevation view of the magnetic suppression assembly 40 along the beam axis is shown in FIG. 4. The magnetic suppression assembly 40 may include three sets of permanent magnets positioned on opposite sides of a generally rectangular opening 60. In a preferred embodiment, the opening 60 is about 9 inches high (X dimension) by 4 inches wide (Y dimension). Ion beam 12 passes through opening 60 in the Z direction shown in FIG. 3. Main suppression magnets 62 and 64 constitute a suppression magnet structure and generate a magnetic field in opening 60 of sufficient strength to inhibit escape of electrons from Faraday cage 30. In a preferred embodiment, the magnetic field at the center of opening 60 adjacent main suppression magnets 62 and 64 is on the order of 750 to 800 Gauss. The main suppression magnets 62 and 64 produce a magnetic field $B_y$ that is oriented in the Y direction as shown in FIG. 4. The magnetic field strength is preferably relatively uniform in the X direction.

A further requirement on the magnetic suppression assembly 40 is to produce a steep gradient in the magnetic field strength along the Z direction between magnetic suppression assembly 40 and electron flood gun 34, such that the magnetic field strength is nearly zero in the region between electron flood gun 34 and wafer 14. In particular, the magnetic field strength drops from about 750 Gauss to one or two Gauss over a distance of a few centimeters. The steep gradient is necessary to prevent the magnetic field from interfering with operation of the electron flood gun 34 and has also been found necessary for proper operation of the magnetic suppression assembly 40 in inhibiting escape of electrons from Faraday cage 30. The steep gradient is achieved by field cancellation magnets 68 and 70, which constitute a cancellation magnet structure and are positioned on opposite sides of opening 60 downstream of magnets 62 and 64 toward wafer 14. The field cancellation magnets 68 and 70 produce a magnetic field with opposite polarity from the magnetic field produced by main suppression magnets 62 and 64 and thereby effectively cancel the magnetic field produced by magnets 62 and 64 in the region between electron flood gun 34 and wafer 14. In a preferred embodiment, the field cancellation magnets 68 and 70 produce a magnetic field of somewhat lower strength than magnets 62 and 64 but effectively cancel the magnetic field in the region between electron flood gun 34 and wafer 14, because they are closer to wafer 14 than magnets 62 and 64. Cancellation of the magnetic fields in the region between electron flood gun 34 and wafer 14 may be further assisted by an iron field clamp 72 positioned between field cancellation magnets 68, 70 and wafer 14. The field clamp 72 is in the form of a iron plate having an opening for passage of ion beam 12.

A further feature of the magnetic suppression assembly 40 relates to magnetic deflection of ion beam 12, as the ion beam 12 passes through the magnetic fields produced by magnetic suppression assembly 40. As is well known in the art, an ion beam passing through a magnetic field is deflected in a direction perpendicular to the magnetic field and perpendicular to the beam direction. As discussed above, it is important in ion implantation to control the angle of incidence of the ion beam on the semiconductor wafer. However, an ion beam passing through a magnetic field of 750 Gauss will be deflected by up to several degrees, depending on the ion species and the ion energy. The deflection is greatest for low energy ions. This deflection could be compensated for by tilting the wafer by a corresponding angle to achieve the desired angle of incidence. However, this approach is relatively difficult and impractical. Accordingly, the magnetic suppression assembly 40 is configured to produce zero or nearly zero angular deflection of the ion beam 12. In particular, angle correction magnets 74 and 76 are positioned upstream of main suppression magnets 62 and 64 toward ion beam generator 10 on opposite sides of opening 60. Angle correction magnets 74 and 76 constitute an angle correction magnet structure and produce a magnetic field with opposite polarity from the magnetic field produced by main suppression magnets 62 and 64. The field strength and position of magnets 74 and 76 is selected such that the ion beam 12 is deflected first in one direction by magnets 74 and 76 and then in the opposite direction by magnets 62 and 64, with the net angular deflection produced by the magnetic suppression assembly 40 being zero or nearly zero. The ion beam 12 is displaced from its original path by a small distance, typically about one centimeter or less. However, the displacement of the ion beam 12 is not a problem if the displacement is small in comparison with the ion beam diameter, and the ion beam remains within the beam openings.

The magnetic suppression assembly 40 further includes iron yokes 80 and 82. Yoke 80 is attached to magnets 62, 68 and 74, and to field clamp 72. Yoke 82 is connected to magnets 64, 70 and 76, and to field clamp 72. The yokes 80 and 82 provide return paths for the magnetic fields generated by the magnets to which they are attached. As shown in FIG. 4, multiple magnets 74 and 76 may be provided along opposite sides of opening 60. Magnets 62, 64, 68 and 70 may have a similar configuration.

Figure 5:
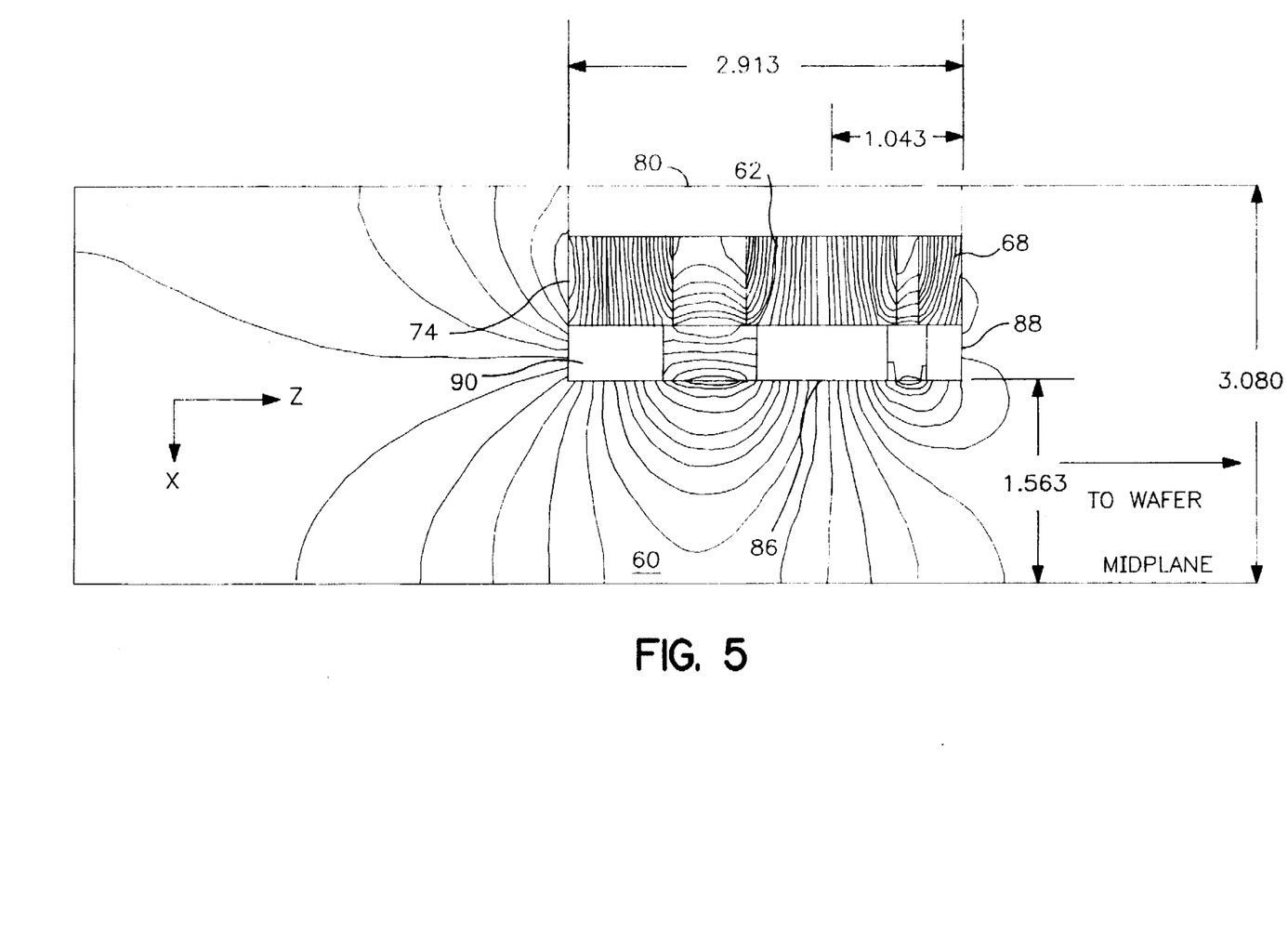
FIG. 5 is a top cross-sectional view of a first example of the magnetic suppression assembly in accordance with the present invention.

A first example of the magnetic suppression assembly 40 is illustrated in FIG. 5. Like elements in FIGS. 3-5 have the same reference numerals. Magnetic field lines are shown in the lower half of FIG. 5. The magnetic suppression assembly and its magnetic fields are symmetrical with respect to a midplane 61 of opening 60. Iron pole pieces 86, 88 and 90 are mounted on magnets 62, 68 and 74, respectively, adjacent to opening 60 to control magnetic field distribution in opening 60. Iron pole pieces 86' 88' and 90' are mounted on magnets 64, 70 and 76, respectively, on the opposite side of opening 60. The magnetic suppression assembly of FIG. 5 further includes an isolation magnet 92 between pole pieces 86 and 90, and an isolation magnet 94 between pole pieces 86 and 88. An isolation magnet 92' is positioned between pole pieces 86' and 90', and an isolation magnet 94' is positioned between pole pieces 86' and 88' on the opposite side of opening 60. The magnetic suppression assembly of FIG. 5 does not utilize a field clamp.

In a permanent magnet assembly where adjacent north and south magnet poles, such as the adjacent north and south poles of magnets 62 and 74, are arranged on opposite sides of a gap such as opening 60, a large amount of the generated flux does not cross the gap from one pole to the opposite pole on the other side of the gap. This flux is sometimes referred to as leakage flux. This means that flux is generated which is not useful in the gap, and such a design in inefficient. A way to make a more efficient design is to use isolation permanent magnets between the adjacent poles. These magnets are oriented to oppose and prevent most of the leakage flux and thus make a much more efficient design.

The permanent magnets 62, 64, 68, 70, 74, 76, 92, 92', 94 and 94' are preferably samarium cobalt permanent magnets, which produce high magnetic field strength in a relatively small volume. In the example of FIG. 5, dimension L is 2.91 inches, dimension D1 is 1.56 inches and dimension D2 is 3.08 inches. The exact configuration of the three iron poles surrounded by five permanent magnets on each side of the beam path is determined by modeling and is optimized so as to provide the required magnetic field distribution shown in FIG. 6.

Figure 6:
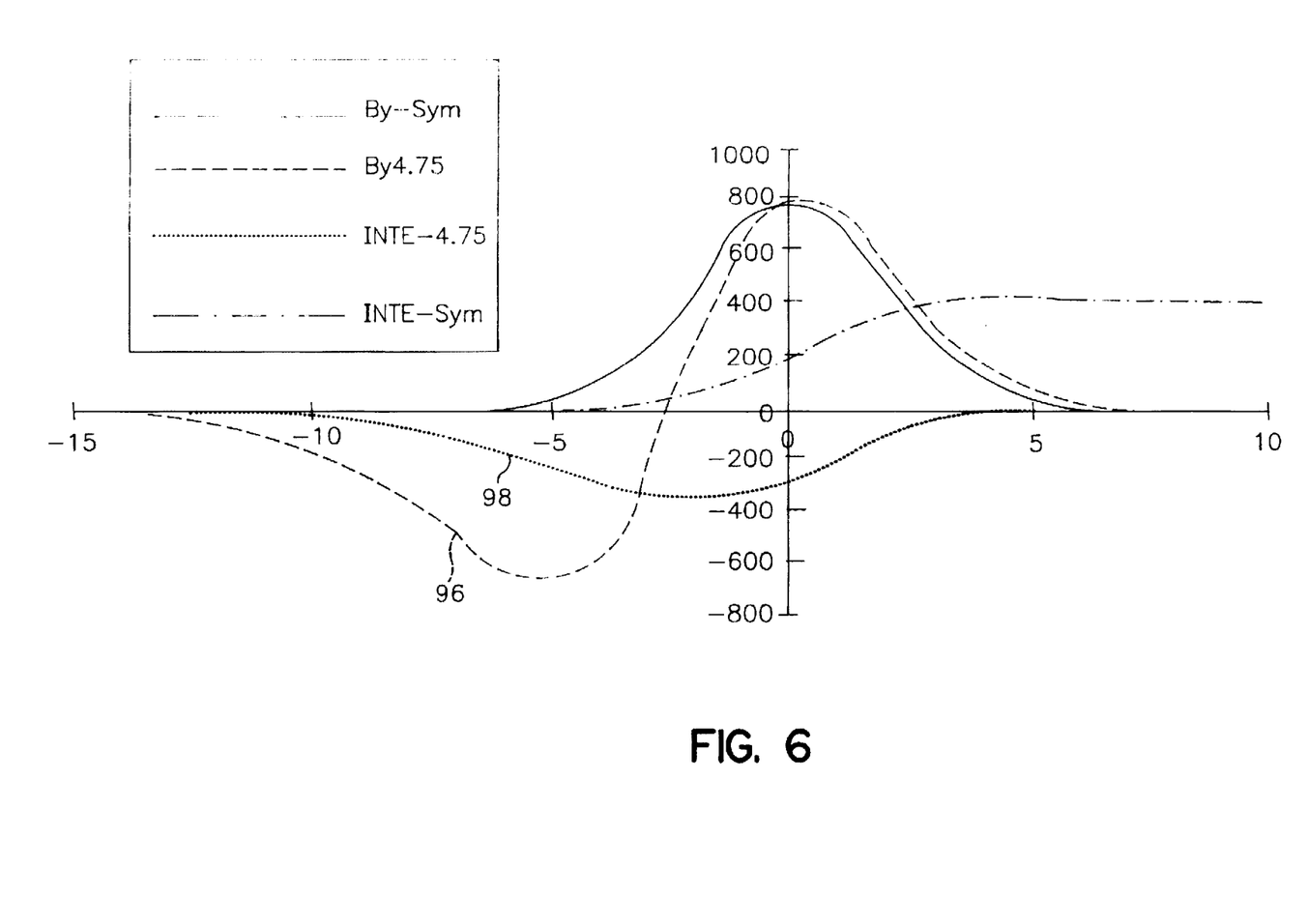
FIG. 6 is a graph of magnetic field strength as a function of distance along the ion beam axis.

A graph of magnetic field strength as a function of distance along the Z axis, or beam path, is shown in FIG. 6. In FIG. 6, magnetic field strength is plotted as a function of distance in centimeters along the Z axis. The origin of the Z axis is at the point between magnets 62 and 64 where the magnetic field strength has a maximum value. Positive Z values are in the direction of wafer 14. The magnetic field strength, $B_y$, is represented by curve 96. It can be seen that the magnetic field strength in a region in front of magnetic suppression assembly 40 has the opposite polarity from the peak magnetic field within the magnetic suppression assembly. This produces zero or nearly zero net angular deflection of the ion beam as described above. The integral of the magnetic field strength along the Z axis is represented by curve 98. The zero value of curve 98 near wafer 14 indicates zero or nearly zero net angular deflection of the ion beam 12.

Figure 7:
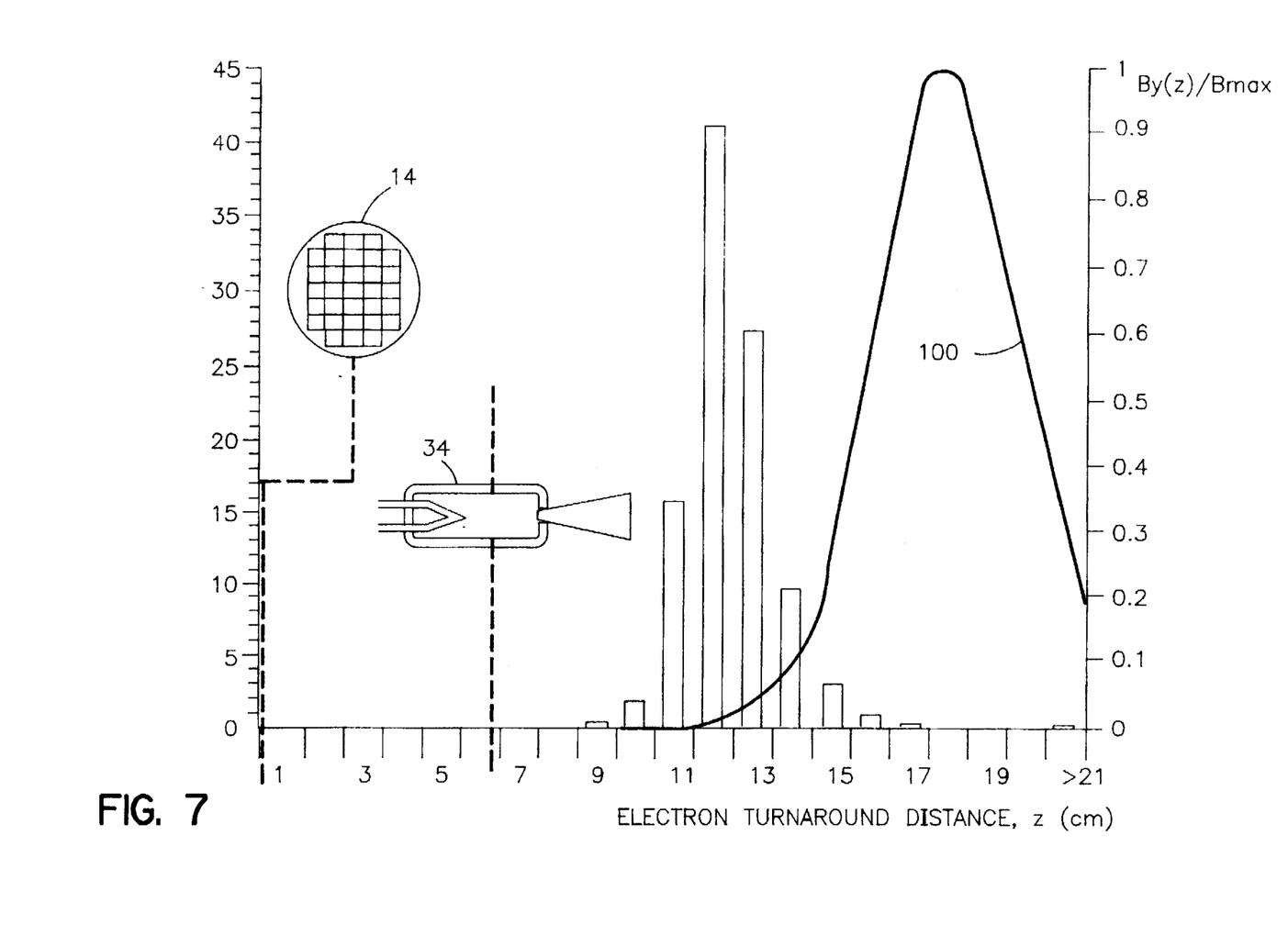
FIG. 7 is a graph showing percent of electrons turning around within the Faraday cage and relative magnetic field strength as a function of distance along the ion beam axis.

A graph of calculated electron turnaround statistics in the magnetic suppression assembly 40 is shown in FIG. 7. In FIG. 7, percent of electrons turning around as a function of distance from wafer 14 is plotted as a bar graph 102. The data is plotted for a 60 KeV, 25 ma arsenic ion (As+) beam with 1.0 cm Gaussian beam radius, 85% beam neutralization and 2000 secondary electrons. The wafer 14 is located at Z=0, and the electron flood gun 34 is located at Z=5.8 cm in FIG. 7. Substantially all of the electrons have turned around by a distance of about 17 to 18 centimeters from wafer 14. It has been determined that less than about 0.2% of the electrons escape from Faraday cage 30 using the magnetic suppression assembly of the present invention. In FIG. 7, the relative magnetic field strength $B_y(z)/B_{max}$ along Z-axis is plotted as curve 100. The magnetic field strength has a maximum at a distance of about 17.5 cm from wafer 14 and has a very small value in the region between electron flood gun 34 and wafer 14. In particular, the magnetic field strength is preferably less than about two Gauss in the region between electron flood gun 34 and wafer 14. Modeling and measurement show that this field condition is met, not only on axis as shown in FIG. 7, but also transverse to the axis. As discussed above, the steep gradient in magnetic field along the Z axis between magnetic suppression assembly 40 and electron flood gun 34 is important in effective electron suppression and in assuring proper charge neutralization.

Figure 8:
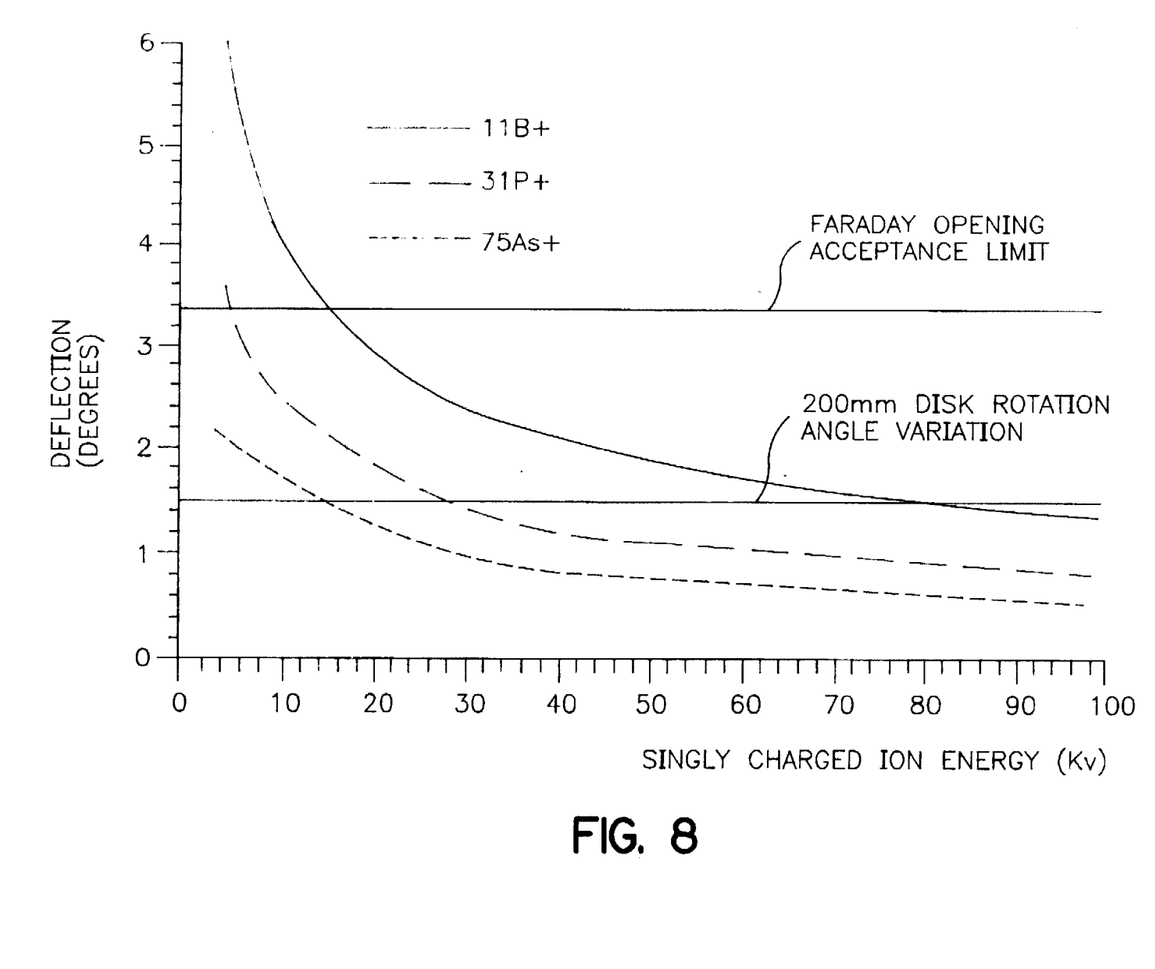
FIG. 8 is a graph of deflection angle as a function of ion energy for different ion species.

A graph of calculated beam deflection as a function of ion energy for different ion species is shown in FIG. 8 for the case where angle correction magnets 74 and 76 are not used. A magnetic field of 700 Gauss acts on the beam over a distance of 4.6 cm. Curve 110 indicates deflection angle for singly charged boron ions (11B+), curve 112 indicates deflection angle for singly charged phosphorus ions (31P+) and curve 114 indicates deflection angle for singly charged arsenic ions (75As+). For comparison, line 116 indicates the Faraday opening acceptance limit, and line 118 indicates 200 mm disk rotation angle variation. This graph indicates that the angular deflection of the ion beam can be significant, particularly at low energies.

Figure 9:
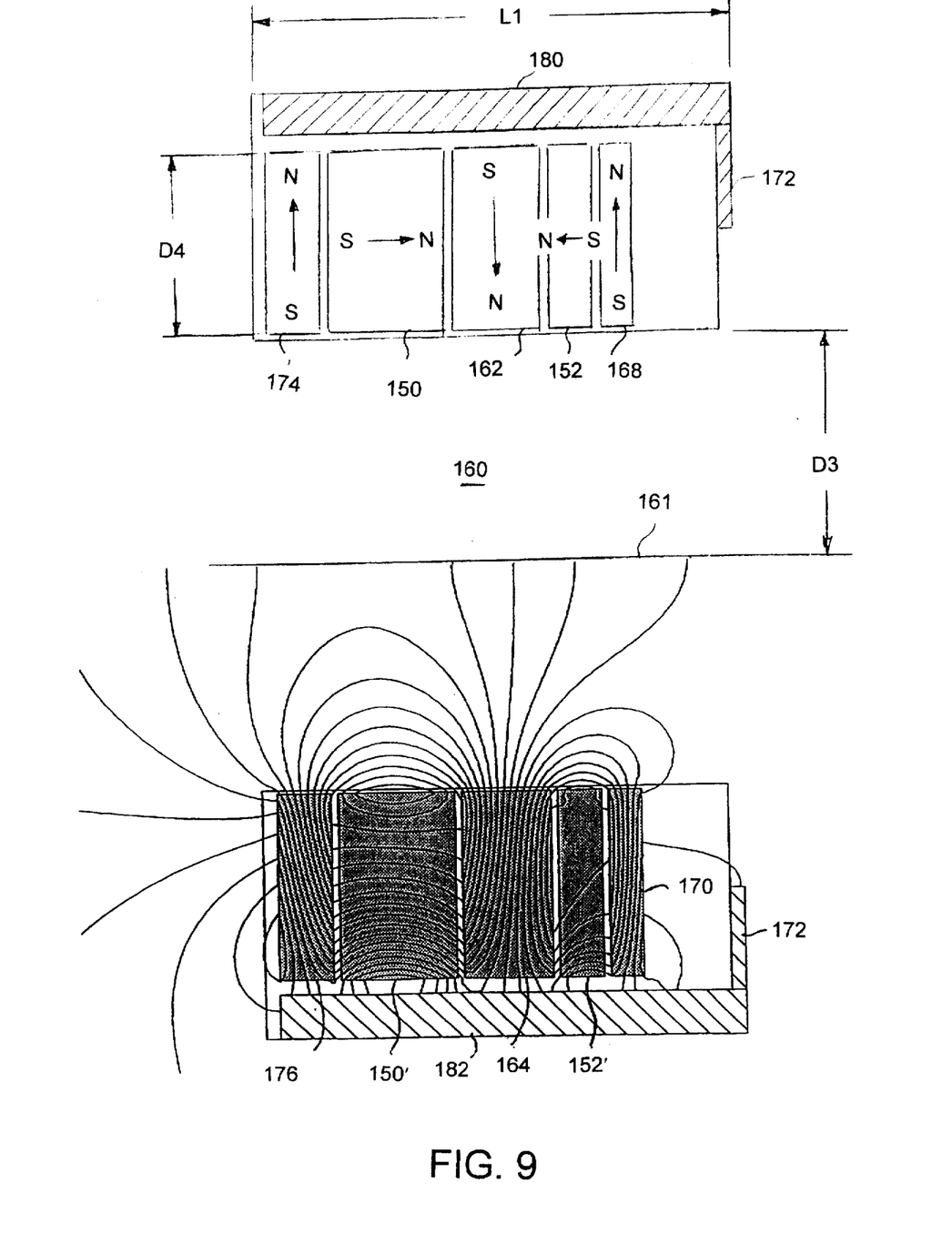
FIG. 9 is a top cross-sectional view of a second example of the magnetic suppression assembly in accordance with the present invention.

A second example of the magnetic suppression assembly 40 is illustrated in FIG. 9. Magnetic field lines are shown in the lower half of FIG. 9. The magnetic suppression assembly and its magnetic fields are symmetrical with respect to a midplane 161 of an opening 160. The assembly includes main suppression magnets 162 and 164, field cancellation magnets 168 and 170, and angle correction magnets 174 and 176, as described above in connection with FIG. 3. The assembly further includes an isolation magnet 150 between magnets 162 and 174, and an isolation magnet 152 between magnets 162 and 168. On the opposite side of opening 160, an isolation magnet 150' is located between magnets 164 and 176, and an isolation magnet 152' is located between magnets 164 and 170. The assembly further includes yokes 180 and 182, which provide return paths for the magnetic fields generated by the magnets, and a field clamp 172 affixed to yokes 180 and 182. The field clamp 172 is positioned between field cancellation magnets 168, 170 and the wafer. The configuration of the magnetic suppression assembly of FIG. 9 allows a larger beam opening in the same axial space. Iron pole pieces are not utilized. In the example of FIG. 9, dimension D3 is 1.97 inches, dimension D4 is 1.625 inches and dimension L1 is 4.085 inches. The axial dimensions of magnets 174, 150, 162, 152 and 168 are 0.445 inch, 0.970 inch, 0.770 inch, 0.385 inch and 0.275 inch, respectively. It will be understood that these dimensions are given by way of example only and are in no way limiting as to the scope of the present invention.

While there have been shown and described what are at present considered the preferred embodiments of the present invention, it will be obvious to those skilled in the art that various changes and modifications may be made therein without departing from the scope of the invention as defined by the appended claims.

What is claimed is:

1. A magnetically suppressed Faraday system for use in an ion beam treatment system, comprising:
   a Faraday cage defining a chamber having an entrance and a downstream end positioned adjacent to a workpiece, said chamber providing a beam path for an ion beam between said entrance and said workpiece; and
   a magnetic suppression assembly positioned at the entrance of said chamber, said magnetic suppression assembly including a suppression magnet structure for producing suppression magnetic fields of sufficient strength to inhibit escape of electrons from said chamber and a field cancellation magnet structure for producing cancellation magnetic fields for substantially canceling magnetic fields, produced by other magnets in said magnetic suppression assembly, near the downstream end of said chamber.

2. A magnetically suppressed Faraday system as defined in claim 1 further comprising a flood gun, positioned near the downstream end of said chamber, for providing electrons at the downstream end of said chamber.

3. A magnetically suppressed Faraday system as defined in claim 1 wherein said magnetic suppression assembly produces a net magnetic field of less than about 2 Gauss near the downstream end of said chamber.

4. A magnetically suppressed Faraday system as defined in claim 1 wherein said magnetic suppression assembly produces a maximum magnetic field of at least 750 Gauss at the entrance of said chamber and a gradient along said beam path over a distance of less than 10 centimeters to a magnetic field of less than about 2 Gauss near the downstream end of said chamber.

5. A magnetically suppressed Faraday system as defined in claim 1 wherein said field cancellation magnet structure is positioned between said suppression magnet structure and the downstream end of said chamber, and has opposite polarity from said suppression magnet structure.

6. A magnetically suppressed Faraday system as defined in claim 1 wherein said suppression magnetic fields and said cancellation magnetic fields are transverse to said beam path.

7. A magnetically suppressed Faraday system as defined in claim 1 wherein said suppression magnet structure comprises suppression magnet elements positioned on opposite sides of said beam path.

8. A magnetically suppressed Faraday system as defined in claim 7 wherein said cancellation magnet structure comprises cancellation magnet elements positioned on opposite sides of said beam path between said suppression magnet structure and the downstream end of said chamber.

9. A magnetically suppressed Faraday system as defined in claim 1 wherein said magnetic suppression assembly further includes an angle correction magnet structure for producing angle correction magnetic fields selected such that said ion beam is subjected to zero or nearly zero net angular deflection as it passes through the Faraday system.

10. A magnetically suppressed Faraday system as defined in claim 9 wherein said suppression magnet structure comprises suppression magnet elements positioned on opposite sides of said beam path, said cancellation magnet structure comprises cancellation magnet elements positioned on opposite sides of said beam path between said suppression magnet structure and the downstream end of said chamber, and said angle correction magnet structure comprises angle correction magnet elements positioned on opposite sides of said beam path upstream of said suppression magnet structure, said magnetic suppression assembly further comprising first pole pieces disposed on said suppression magnet elements, second pole pieces disposed on said cancellation magnet elements, third pole pieces disposed on said angle correction magnet elements, first isolation magnets disposed between said first and second pole pieces, and second isolation magnets disposed between said first and third pole pieces.

11. A magnetically suppressed Faraday system as defined in claim 9 wherein said suppression magnet structure comprises suppression magnet elements positioned on opposite sides of said beam path, said cancellation magnet structure comprises cancellation magnet elements positioned on opposite sides of said beam path between said suppression magnet structure and the downstream end of said chamber, and said angle correction magnet structure comprises angle correction magnet elements positioned on opposite sides of said beam path upstream of said suppression magnet structure, said magnetic suppression assembly further comprising first isolation magnets disposed between said suppression magnet elements and said cancellation magnet elements, second isolation magnets disposed between said suppression magnet elements and said angle correction magnet elements, and a magnetic field clamp positioned between said cancellation magnet structure and said workpiece, said field clamp having an opening for passing the ion beam.

12. A magnetically suppressed Faraday system for use in an ion beam treatment system, comprising:
   a Faraday cage defining a chamber having an entrance and a downstream end positioned adjacent to a workpiece, said chamber providing a beam path for an ion beam between said entrance and said workpiece; and
   a magnetic suppression assembly positioned at the entrance of said chamber, said magnetic suppression assembly including magnetic means for producing along said beam path magnetic fields which inhibit escape of electrons from said chamber, which have a steep gradient along said beam path between the entrance and the downstream end of said chamber and which produce zero or nearly zero net angular deflection of said ion beam.

13. A magnetically suppressed Faraday system as defined in claim 12 wherein said magnetic means comprises:
   a suppression magnet structure for producing suppression magnetic fields of sufficient strength to inhibit escape of electrons from said chamber,
   a field cancellation magnet structure for producing cancellation magnetic fields for substantially canceling magnetic fields, produced by other magnets in said magnetic suppression assembly, near the downstream end of said chamber, and
   an angle correction magnet structure for producing angle correction magnetic fields selected such that the ion beam is subjected to zero or nearly zero net angular deflection as it passes through the Faraday system.

14. A magnetically suppressed Faraday system as defined in claim 13 wherein said suppression magnet structure comprises suppression magnet elements positioned on opposite sides of said beam path, said cancellation magnet structure comprises cancellation magnet elements positioned on opposite sides of said beam path between said suppression magnet structure and the downstream end of said chamber, and said angle correction magnet structure comprises angle correction magnet elements positioned on opposite sides of said beam path upstream of said suppression magnet structure, said magnetic suppression assembly further comprising first pole pieces disposed on said suppression magnet elements, second pole pieces disposed on said cancellation magnet elements, third pole pieces disposed on said angle correction magnet elements, first isolation magnets disposed between said first and second pole pieces, and second isolation magnets disposed between said first and third pole pieces.

15. A magnetically suppressed Faraday system as defined in claim 13 wherein said suppression magnet structure comprises suppression magnet elements positioned on opposite sides of said beam path, said cancellation magnet structure comprises cancellation magnet elements positioned on opposite sides of said beam path between said suppression magnet structure and the downstream end of said chamber, and said angle correction magnet structure comprises angle correction magnet elements positioned on opposite sides of said beam path upstream of said suppression magnet structure, said magnetic suppression assembly further comprising first isolation magnets disposed between said suppression magnet elements and said cancellation magnet elements, second isolation magnets disposed between said suppression magnet elements and said angle correction magnet elements, and a magnetic field clamp positioned between said cancellation magnet structure and said workpiece, said field clamp having an opening for passing the ion beam.

16. A magnetically suppressed Faraday system for use in an ion beam treatment system, comprising:
  a Faraday cage defining a chamber having an entrance and a downstream end positioned adjacent to a workpiece, said chamber providing a beam path for an ion beam between said entrance and said workpiece; and
  a magnetic suppression assembly positioned at the entrance of said chamber, said magnetic suppression assembly including a suppression magnet structure for producing suppression magnetic fields of sufficient strength to inhibit escape of electrons from said chamber and an angle correction magnet structure for producing angle correction magnetic fields selected such that said ion beam is subjected to zero or nearly zero net angular deflection as it passes through the Faraday system.

17. A magnetically suppressed Faraday system as defined in claim 16 further comprising a flood gun, positioned near the downstream end of said chamber, for providing electrons at the downstream end of said chamber.

18. A magnetically suppressed Faraday system as defined in claim 17 wherein said magnetic suppression assembly further comprises a field cancellation magnet structure for producing cancellation magnetic fields for substantially canceling magnetic fields, produced by other magnets in said magnetic suppression assembly, near the downstream end of said chamber.

19. An ion implanter comprising:
  an ion source for generating an ion beam and for directing the ion beam along a beam path;
  an end station for positioning a semiconductor wafer in said beam path; and
  a magnetically suppressed Faraday system positioned along said beam path, said magnetically suppressed Faraday system comprising:
    a Faraday cage defining a chamber having an entrance and a downstream end positioned adjacent to the semiconductor wafer, said beam path passing through said chamber between said entrance and said downstream end;
    a flood gun, positioned in said chamber near the downstream end thereof, for providing electrons at the downstream end of said chamber; and
    a magnetic suppression assembly positioned at the entrance of said chamber, said magnetic suppression assembly comprising a suppression magnet structure for producing suppression magnetic fields of sufficient strength to inhibit escape of electrons from said chamber, an angle correction magnet structure for producing angle correction magnetic fields selected such that said ion beam is subjected to zero or nearly zero net angular deflection as it passes through the Faraday system, and a field cancellation magnet structure for producing cancellation magnetic fields for substantially canceling magnetic fields, produced by other magnets in said magnetic suppression assembly, between said flood gun and said semiconductor wafer.

20. An ion implanter as defined in claim 19 wherein said suppression magnet structure comprises suppression magnet elements positioned on opposite sides of said beam path, said cancellation magnet structure comprises cancellation magnet elements positioned on opposite sides of said beam path between said suppression magnet structure and the downstream end of said chamber, and said angle correction magnet structure comprises angle correction magnet elements positioned on opposite sides of said beam path upstream of said suppression magnet structure, said magnetic suppression assembly further comprising first pole pieces disposed on said suppression magnet elements, second pole pieces disposed on said cancellation magnet elements, third pole pieces disposed on said angle correction magnet elements, first isolation magnets disposed between said first and second pole pieces, and second isolation magnets disposed between said first and third pole pieces.

21. An ion implanter as defined in claim 19 wherein said suppression magnet structure comprises suppression magnet elements positioned on opposite sides of said beam path, said cancellation magnet structure comprises cancellation magnet elements positioned on opposite sides of said beam path between said suppression magnet structure and the downstream end of said chamber, and said angle correction magnet structure comprises angle correction magnet elements positioned on opposite sides of said beam path upstream of said suppression magnet structure, said magnetic suppression assembly further comprising first isolation magnets disposed between said suppression magnet elements and said cancellation magnet elements, second isolation magnets disposed between said suppression magnet elements and said angle correction magnet elements, and a magnetic field clamp positioned between said cancellation magnet structure and said workpiece, said field clamp having an opening for passing the ion beam.

22. A magnetically suppressed Faraday system for use in an ion beam treatment system, comprising:

a Faraday cage defining a chamber having an entrance and a downstream end positioned adjacent to a workpiece, said chamber providing a beam path for an ion beam between said entrance and said workpiece; and a magnetic suppression assembly positioned at the entrance of said chamber, said magnetic suppression assembly including suppression magnet elements positioned on opposite sides of said beam path for producing suppression magnetic fields of sufficient strength to inhibit escape of electrons from said chamber, field cancellation magnet elements positioned on opposite sides of said beam path between said suppression magnet elements and the downstream end of said chamber for producing cancellation magnetic fields for substantially canceling magnetic fields, produced by other magnets in said magnetic suppression assembly, near the downstream end of said chamber and angle correction magnet elements positioned on opposite sides of said beam path upstream of said suppression magnet elements for producing angle correction magnetic fields selected such that said ion beam is subjected to zero or nearly zero net angular deflection as it passes through the Faraday system.

23. A magnetically suppressed Faraday system as defined in claim 22, further comprising first pole pieces disposed on said suppression magnet elements, second pole pieces disposed on said cancellation magnet elements, third pole pieces disposed on said angle correction magnet elements, first isolation magnets disposed between said first and second pole pieces and second isolation magnets disposed between said first and third pole pieces.

24. A magnetically suppressed Faraday system as defined in claim 22, wherein said magnetic suppression assembly further includes first isolation magnets disposed between said suppression magnet elements and said cancellation magnet elements, and second isolation magnets disposed between said suppression magnet elements and said angle correction magnet elements.

* * * * *